(12) United States Patent
Shahidi et al.

(10) Patent No.: US 8,213,120 B2
(45) Date of Patent: Jul. 3, 2012

(54) FLEXIBLE CABLE COMPRISING LIQUID CRYSTAL POLYMER

(75) Inventors: Sassan K. Shahidi, San Jose, CA (US); Larry LeeRoy Tretter, Tucscon, AZ (US); George G. Zamora, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 1010 days.

(21) Appl. No.: 11/852,667

(22) Filed: Sep. 10, 2007

(65) Prior Publication Data

US 2009/0067089 A1    Mar. 12, 2009

(51) Int. Cl.
*G11B 23/02* (2006.01)
*G11B 33/04* (2006.01)

(52) U.S. Cl. ......................... 360/137; 360/128

(58) Field of Classification Search ................... 720/605, 720/652, 659, 663, 676, 685, 690; 360/137, 360/272, 281, 281.7, 245.9, 271.9, 128; 174/117 F, 174/117 FF, 254, 268; 361/749, 750
See application file for complete search history.

(56) References Cited

U.S. PATENT DOCUMENTS

| | | | |
|---|---|---|---|
| 4,680,557 A * | 7/1987 | Compton | 333/1 |
| 5,844,783 A * | 12/1998 | Kojima | 361/777 |
| 5,995,328 A * | 11/1999 | Balakrishnan | 360/245.9 |
| 6,046,886 A * | 4/2000 | Himes et al. | 360/245.9 |
| 6,356,414 B1 | 3/2002 | Traskos et al. | 360/244.3 |
| 6,372,992 B1 * | 4/2002 | Yang | 174/117 F |
| 6,410,847 B1 * | 6/2002 | Allen et al. | 174/390 |
| 6,424,499 B1 * | 7/2002 | Balakrishnan et al. | 360/245.9 |
| 6,574,075 B2 | 6/2003 | Traskos et al. | 360/244.3 |
| 6,696,163 B2 | 2/2004 | Yang | 428/458 |
| 6,815,620 B2 * | 11/2004 | Dodsworth et al. | 174/258 |
| 6,867,948 B1 | 3/2005 | Schulz et al. | 360/245.9 |
| 7,538,986 B2 * | 5/2009 | Iben | 360/323 |
| 2004/0154824 A1* | 8/2004 | Hesse | 174/117 F |
| 2005/0134999 A1* | 6/2005 | Poorman et al. | 360/90 |
| 2006/0098351 A1* | 5/2006 | Iben | 360/323 |

* cited by examiner

*Primary Examiner* — Allen Cao
(74) *Attorney, Agent, or Firm* — Zilka-Kotab, PC

(57) ABSTRACT

A tape drive system according to one general embodiment includes a magnetic head; a drive mechanism for passing a magnetic recording tape over the head; a cable coupled to the magnetic head, the cable comprising a first layer of liquid crystal polymer, and at least 16 electrically conductive leads operatively coupled to the first layer of liquid crystal polymer; and a controller coupled to the cable, and communicating with the head using the cable. A cable according to another general embodiment includes a first layer of liquid crystal polymer; and at least 16 electrically conductive leads operatively coupled to the first layer of liquid crystal polymer.

20 Claims, 2 Drawing Sheets

FLEXIBLE CABLE COMPRISING LIQUID CRYSTAL POLYMER

FIELD OF THE INVENTION

The present invention relates to cables, and more particularly, this invention relates to cables having liquid crystal polymer.

BACKGROUND OF THE INVENTION

Magnetic head-based systems have been widely accepted in the computer industry as a cost-effective form of data storage. In a magnetic tape drive system, a magnetic tape containing a multiplicity of laterally positioned data tracks that extend along the length of the tape is drawn across a magnetic read/write transducer, referred to as a magnetic tape head. The magnetic tape heads can record and read data along the length of the magnetic tape surface as relative movement occurs between the heads and the tape.

In a magnetic disk drive system, a magnetic recording medium in the form of a disk rotates at high speed while a magnetic head "flies" slightly above the surface of the rotating disk. The magnetic disk is rotated by means of a spindle drive motor.

Magnetic tape heads used in tape drive storage products are continually improving by providing faster data read/write transmission performance. The tape head is interconnected with a flexible circuit/cable to the electronic read/write channels. A typical tape head depends on the flexible circuit/cables to displace to the proper servo/index channels with minimal energy. For this reason, this places a requirement on the flexible circuit/cable to be thin and narrow. An additional requirement often placed on the flexible circuit/cable is to minimize conductor width/space to match the head geometry and maximize the storage density.

Traditionally, these flexible circuits/cables are made with polyimide for both the base and cover layers. The minimum thickness is achieved using two copper layers (which may include other evaporated or sputtered elements for adhesion reasons) adhered to the base layer (sometimes referred to as an adhesiveless base layer). The copper is usually isolated with a cover layer on each side (i.e., top and bottom cover layers).

Each generation of tape drive increases performance. This will place additional requirements on the flexible circuit/cable. The traditional polyimide based material for the flexible circuit/cable has reached its data transmission capabilities. Accordingly, a replacement is needed for future products.

SUMMARY OF THE INVENTION

A tape drive system according to one general embodiment includes a magnetic bead; a drive mechanism for passing a magnetic recording tape over the head; a cable coupled to the magnetic head, the cable comprising a first layer of liquid crystal polymer, and at least 16 electrically conductive leads operatively coupled to the first layer of liquid crystal polymer; and a controller coupled to the cable, and communicating with the head using the cable.

A cable according to another general embodiment includes a first layer of liquid crystal polymer; and at least 16 electrically conductive leads operatively coupled to the first layer of liquid crystal polymer.

A cable according to yet another general embodiment includes a first layer of liquid crystal polymer; and a plurality of conductive leads operatively coupled to the first layer of liquid crystal polymer, wherein a width of each lead, in a direction perpendicular to an axis of the lead and parallel to a plane extending between the conductive leads and the first layer of liquid crystal polymer, is less than about 75 microns, wherein a spacing between the leads is less than about 50 microns.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
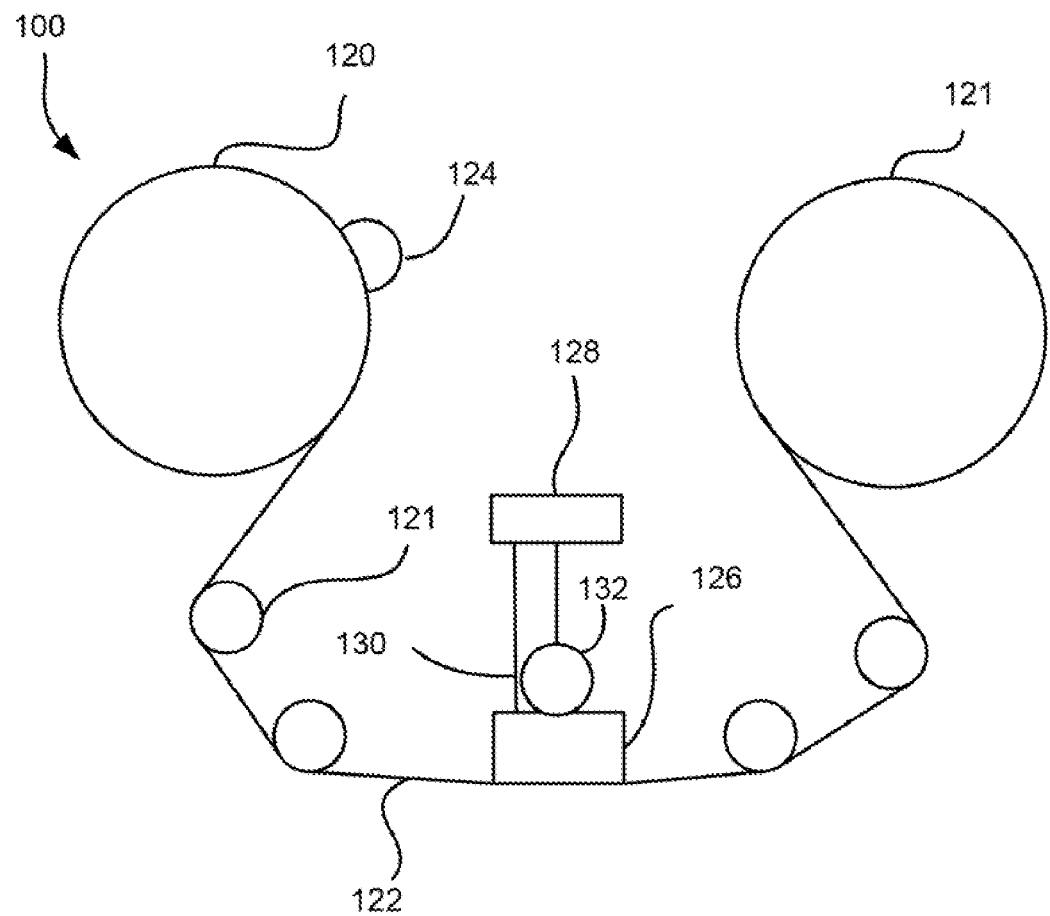
FIG. 1 is a schematic diagram of a tape drive system according to one embodiment of the present invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

In the drawings, like and equivalent elements are numbered the same throughout the various figures.

The following description discloses several preferred embodiments of cables having improved performance relative to existing polyimide-based cables, and system implementing such cables.

One general embodiment of the present invention, which can be described for example with reference to FIG. 1, is directed to a tape drive system 100. The tape drive system 100 includes a magnetic head 126, and a drive mechanism 124 for passing a magnetic recording tape 122 over the head 126. A cable 130 is coupled to the magnetic head 126, the cable 130 comprising a first layer of liquid crystal polymer, and at least 16 electrically conductive leads operatively coupled to the first layer of liquid crystal polymer. A controller 128 is coupled to the cable 130, and communicates with the head 126 using the cable 130.

Figure 2:
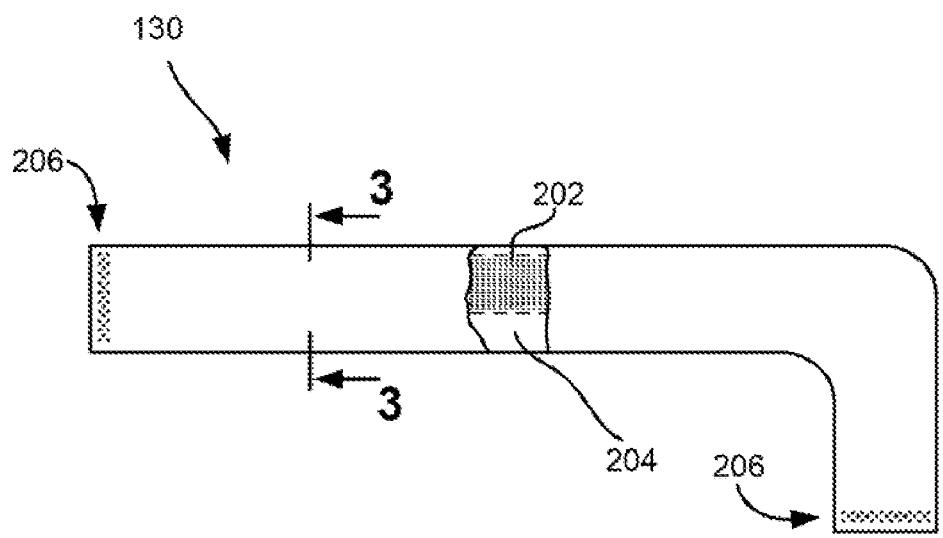
FIG. 2 is a simplified partial breakaway side view, not to scale, of a cable according to one embodiment.
Figure 3:
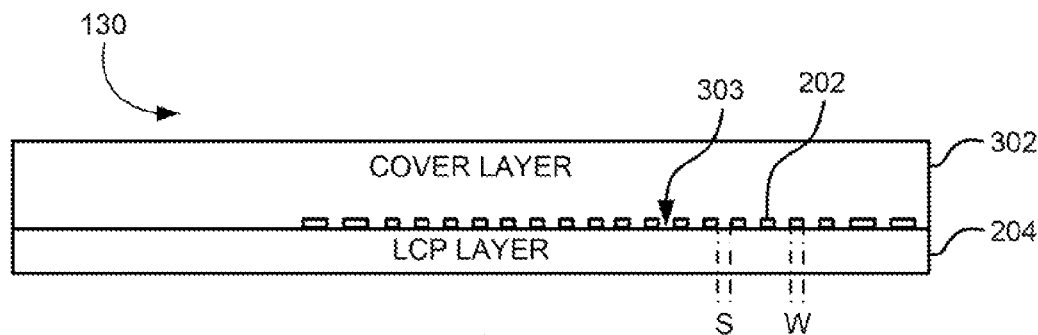
FIG. 3 is a cross sectional view, not to scale, of the cable of FIG. 2, taken along Line 3-3 of FIG. 2.

Another general embodiment of the present invention, which can be described for example with reference to FIGS. 2-3, includes a cable 130 having a first layer 202 of liquid crystal polymer, and at least 16 electrically conductive leads 202 operatively coupled to the first layer 204 of liquid crystal polymer.

Yet another general embodiment of the present invention, which can be described for example with reference to FIGS. 2-3, includes a cable 130 having a first layer 204 of liquid crystal polymer, and a plurality of conductive leads 202 operatively coupled to the first layer 204 of liquid crystal polymer, wherein a width W of each lead, in a direction perpendicular to an axis of the lead and parallel to a plane extending between the conductive leads 202 and the first layer of liquid crystal polymer, is less than about 75 microns, wherein a spacing S between the leads is less than about 50 microns.

Tape Drive Systems

FIG. 1 illustrates a simplified tape drive system 100 according to one embodiment of the present invention. While one specific implementation of a tape drive 100 is shown in FIG. 1, it should be noted that various embodiments presented herein may be implemented in the context of any type of tape drive system.

As shown, a tape supply cartridge 120 and a take-up reel 121 are provided to support a tape 122. These may form part of a removable cassette and ate not necessarily part of the system 100.

Guides 121 guide the tape 122 across a preferably bidirectional tape head 126. An actuator 132 controls position of the head 126 relative to the tape 122. The tape head 126 is in turn coupled to a controller assembly 128 via a connector cable 130. The controller 128, in turn, controls head functions such as servo following, write functions and read functions, etc. The controller 128 runs under the control of computer instructions typically in firmware or software run locally or on a host system.

The tape drive 100 may further include drive motor(s) 124 to drive the tape supply cartridge 120 and the take-up reel 121 to move the tape 122 over the head 126. An interface may also be provided for communication between the tape drive and a host (integral or external) to send and receive the data and for controlling the operation of the tape drive and communicating the status of the tape drive to the host, all as will be understood by those of skill in the art. Examples of a host system include a computer or other processor-based system or network, etc. in communication with the tape drive 100.

In another embodiment, the tape drive system is part of a larger library of tape drive systems that provide coordinated data backup using several drives.

Cables

Referring to FIGS. 2 and 3, a typical cable 130 includes a plurality of electrically conductive leads 202 sandwiched between two or more dielectric layers. The leads 202 may be formed of any electrically conductive material, such as copper, aluminum, gold, etc. The illustrative array of leads 202 shown in FIG. 2 include two pairs of servo leads flanking a subarray of element leads. Of course, the number of leads may vary based on the particular application for which the cable is intended. Thus, many other configurations of leads are contemplated, including arrays without servo leads, leads in cables for use with devices other than tape drive systems, etc.

An illustrative cable for a 16 channel read/write tape head has 64 element leads (16 leads to the writers, 16 leads from the writers, 16 leads to the readers, 16 leads from the readers) and 4 to 8 servo leads. An illustrative cable for a 32 channel read/write tape head has 128 (=32×4) element leads and 4 to 12 servo leads.

Contact pads 206 in communication with the leads 202 are typically positioned on opposite ends of the cable 130. In a tape drive system, for example, one set of contact pads 206 is typically bonded or otherwise coupled to a head, while the other set of contact pads is typically bonded or otherwise coupled to a controller, circuit board, another cable, etc. Any type of bonding or coupling is acceptable, including solder, anisotropic conductive films, compression bonding, plug and socket, etc.

While a generally L-shaped cable is shown, the particular shape of the cable is not critical. Accordingly, the cable may be straight, U-shaped, C-shaped, etc.

In one approach, as shown in FIG. 3, the array of leads 202 may be formed on a layer 204 of Liquid Crystal Polymer (LCP). A dielectric cover layer 302 covers the leads 202. The cover layer 302 may be a single layer or multiple layers. The cover layer 302 may be constructed of any traditional cable material, such as polyimide.

In a particularly preferred approach, the cover layer 302 is formed of LCP, for reasons which shall soon become apparent. A lower surface of the cover layer 302 may have physical characteristics of formation over the leads and have ridges 303 that extend between the leads 202.

LCP is a preferred material for many reasons. It is readily available, it is able to form thin laminates, it is capable of chemical processing, it is solderable (for connector attachment), it has better electrical properties (e.g., lower dielectric constant) than traditional materials, and exhibits better mechanical properties (e.g., lower modulus) than traditional materials.

In one approach to construct a cable of the type shown in FIG. 3, a thin laminate of LCP with a thin layer of copper formed thereon is acquired. Note that the laminate may or may not include seed layers of other metal elements. The copper material can be processed (e.g., fine line and space copper etching) with traditional machines designed to process polyimide.

LCP has much better electrical properties than polyimide. For comparison, generally the relative dielectric constant of polyimide used in tape drives is 3.4, while the relative dielectric constant of LCP is less than 2.8. The loss tangent (i.e., the electrical charge stored within the polymer) is 6 to 8× less than polyimide. These electrical properties allow for placement of conductors very close to each other without causing crosstalk and/or feedthrough issues.

The flexible circuit/cable for a traditional tape drive has 80-100 micron spacing between the leads. This fine conductor geometry increases the amount of crosstalk and feedthrough. To minimize this electrical issue, a fan out of the conductor spaces between non-tracks is increased and maintained down the length of the flexible circuit/cable. This changes the electrical properties, mainly the impedance of the flexible circuit/cable. This change increases the signal reflections and the standing wave ratio. Further, this high spacing between the leads does not allow addition of the number of leads required for devices having a large number of channels, e.g., 32, 64, etc. while remaining within a standard cable form factor. The inventors have found that these drawbacks can be significantly reduced or eliminated by implementing LCP as the base and/or cover layer. Particularly, the lead width and spacing can be significantly reduced, which is critical to some embodiments of cables for tape drive applications, particularly in terms of providing an acceptable data rate and keeping a standard form factor.

In addition, the modulus of LCP is lower than polyimide by approximately 1.5×. This decreases the load on the tape drive actuator allowing better track following. Moreover, the dielectric constant of LCP does not increase with frequency.

Additionally, experimental evidence, presented below, indicates that cables formed with an LCP base layer are more reliable in terms of resistance to fatigue.

Hence, it is believed that LCP will meet any future performance tape drive requirements.

Accordingly, in one preferred embodiment, the spacing S between the leads 202 is less than about 50 microns. In a particularly preferred embodiment, the spacing between the leads is less than about 35 microns.

In a preferred embodiment, a width W of each lead is less than about 75 microns. In a particularly preferred embodiment, a width of each lead, is less than about 50 microns.

The leads are preferably less than about 50 microns thick, more preferably less than about 20 microns thick. In one particularly preferred approach, the thickness of the leads is between about 5 and 15 microns.

An illustrative thickness of the base layer upon which the leads are formed (e.g., LCP layer in FIG. 3) is less than about 50 microns, preferably less than about 30 microns.

Note that larger and smaller dimensions and ranges than those described above are also contemplated.

In one illustrative embodiment, using traditional copper additive processes, a geometry of 30 micron lead width and spacing can be achieved. This geometry may remain constant down the entire length of the flexible circuit/cable. This exemplary flexible circuit/cable has a constant impedance with minimal crosstalk and feedthrough. In addition, the load on the servo mechanism is decreased, thereby extending the life of the actuator.

In another embodiment, the LCP layer need not be the base layer upon which the leads are formed. Rather, the leads may be formed on a layer of traditional material, e.g., polyimide, with LCP used in the cover layer.

Figure 4:
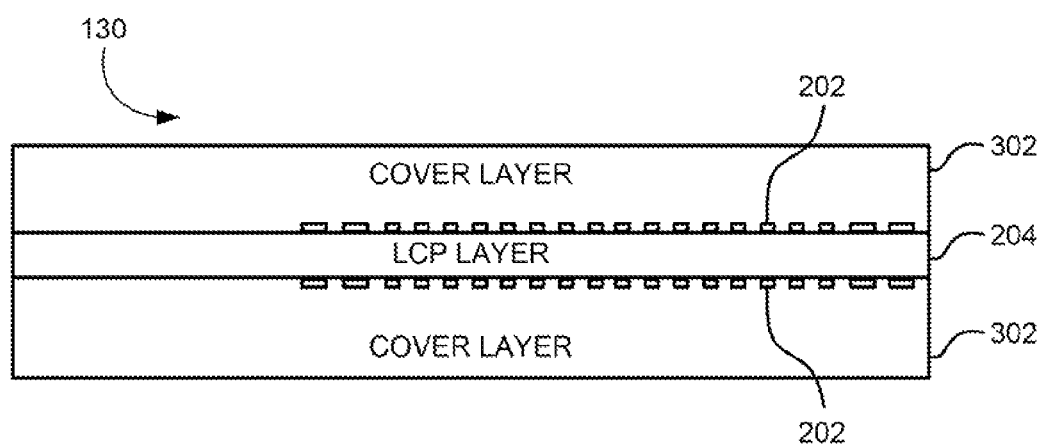
FIG. 4 is a cross sectional view, not to scale, of a cable according to one embodiment.

FIG. 4 illustrates a cable 130 in which at least some of the leads 202 are positioned on one side of the first layer 204 of LCP, while other leads 202 are positioned on another side of the first layer 204 of LCP. The dimensions and materials listed above may be used in such embodiments.

Note that while FIG. 4 is shown with similar stacks of layers on both sides of the first layer 204, variants may include dissimilar stacks of layers on opposite sides of each cable.

Experimental Results

Comparative experiments were performed to determine the resistance to fatigue of a first set of cables formed with a polyimide base layer, and a second set of cables formed with an LCP base layer.

The first set of cables were formed by casting a thin layer of Cu (<20 microns thick) onto opposite sides of a polyimide base layer. The Cu layer was etched to form about 80 total conductors. Polyimide cover layers were then placed over the conductors.

The second set of cables were formed almost identically to the first set of cables, except that an LCP base layer was used. The second set of cables were formed by casting a thin layer of Cu same thickness as used in first set) onto opposite sides of a LCP base layer. The Cu layer was etched to form about 80 total conductors in the same manner and dimensions as the first set of cables. Polyimide cover layers identical to those used in the first set were then placed over the conductors.

First ends of the L-shaped cables were coupled to a shake table, the cable was folded into a "U", and the other ends of the cables were each coupled to an individual "shorted" head. The shorted head was mounted on a slider that allowed the shorted head to move back and forth +4.5 mm and −4.5 mm from a neutral position. The same tester and testing conditions were applied to all cables tested.

Pairs of conductors were coupled to a monitoring system, such that every conductor in each cable was monitored. The table then began to shake, thereby inducing the heads to travel to each extent of possible movement. The number of movement cycles of the shorted heads were recorded with each 18 mm of travel representing one cycle. Upon detecting an increase in resistance in one of the pairs of conductors, the cable as failed and the number of cycles at which the failure occurred was recorded.

Table 1 summarizes the results of the copper fatigue testing of the first set of cables (polyimide base layer).

TABLE 1

| | |
|---|---|
| J301 | failed at 647 thousand cycles |
| J302 | failed at 304 thousand cycles |
| J303 | failed at 357 thousand cycles |
| J304 | failed at 229 thousand cycles |
| J305 | failed at 221 thousand cycles |
| J306 | failed at 402 thousand cycles |

Table 2 summarizes the results of the copper fatigue testing of the second set (LCP base layer) of cables.

TABLE 2

| | |
|---|---|
| J307 | failed at 886 thousand cycles |
| J308 | failed at 3.9 million cycles |
| J309 | failed at 586 thousand cycles |
| J310 | has not failed >8.4 million cycles |
| J311 | has not failed >8.4 million cycles |
| J312 | has not failed >8.4 million cycles |

As can be seen the set of cables with LCP base layer significantly outperformed the set of cables with polyimide base layer.

Conclusion

Although various embodiments have been described as adapted for use with a magnetic tape drive system, the inventive cables may also be used with other electronic devices such as optical storage devices, wireless telephones, personal computers, PDAs, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A tape drive system, comprising:
   a magnetic head;
   a drive mechanism for passing a magnetic recording tape over the head;
   a cable coupled to the magnetic head, the cable comprising a first layer of liquid crystal polymer, and at least 16 electrically conductive leads directly adjacent the first layer of liquid crystal polymer,
   wherein the first layer of liquid crystal polymer has either a planar upper surface on which the leads are positioned, or a lower surface having physical characteristics of formation over the leads and having ridges that extend between the leads,
   wherein all leads of the cable lie in a single plane, wherein a spacing between all adjacent leads is less than about 50 microns,
   wherein a width of each lead along a plane extending through all of the leads and perpendicular to axes of the leads is less than about 75 microns; and
   a controller coupled to the cable, and communicating with the head using the cable.

2. A system as recited in claim 1, wherein the cable further comprises a first array of contact pads coupled to the magnetic head and in electrical communication with the leads, wherein the first array of contact pads has a width measured between outermost contact pads thereof that is greater than a width measured between outermost of the leads near a middle of the cable.

3. A system as recited in claim 1, wherein the cable further comprises a second array of contact pads operatively coupled to the controller and in electrical communication with the leads, wherein the second array of contact pads has a width measured between outermost contact pads thereof that is greater than the width measured between the outermost of the leads near a middle of the cable.

4. A system as recited in claim 1, wherein the first layer of liquid crystal polymer has a planar upper surface on which the leads are positioned, and further comprising a second layer of liquid crystal polymer having a lower surface having physical characteristics of formation over the leads and having ridges that extend between the leads, the leads being sandwiched by the first and second layers of liquid crystal polymer.

5. A system as recited in claim 1, wherein the cable has an L-shaped profile when viewed from a position normal to a plane of the cable and the cable lies flat along its plane, and further comprising an actuator for changing a position of the magnetic head relative to the controller.

6. A system as recited in claim 1, wherein at least 32 electrically conductive leads are operatively coupled to the first layer of liquid crystal polymer, wherein the cable has an L-shaped profile when viewed from a position normal to a plane of the cable and the cable lies flat along its plane.

7. A system as recited in claim 1, wherein a width of each lead, in a direction perpendicular to an axis of the lead and parallel to a plane extending between the conductive leads and the first layer of liquid crystal polymer, is less than about 50 microns, wherein a spacing between the leads is less than about 35 microns, wherein the cable has more than 128 leads, wherein the cable has an L-shaped profile when viewed from a position normal to a plane of the cable and the cable lies flat along its plane, and further comprising an actuator for changing a position of the magnetic head relative to the controller.

8. A system as recited in claim 1, wherein a width of each lead, in a direction perpendicular to an axis of the lead and parallel to a plane extending between the conductive leads and the first layer of liquid crystal polymer, is less than about 50 microns.

9. A cable usable with a tape drive system, comprising:
a first layer of liquid crystal polymer; and
at least 64 electrically conductive leads formed directly on an upper surface of the first layer of liquid crystal polymer, the upper surface of the first layer of liquid crystal polymer adjacent the leads being planar,
wherein a spacing between all adjacent leads is less than about 50 microns,
wherein all of the leads of the cable lie in a single plane, wherein a width of each lead, in a direction perpendicular to an axis of the lead and parallel to a plane extending through all of the conductive leads, is less than about 75 microns.

10. A cable as recited in claim 9, wherein a spacing between the leads is less than about 35 microns, wherein all of the leads of the cable lie in a single plane, wherein a width of each lead, in a direction perpendicular to an axis of the lead and parallel to a plane extending between the conductive leads and the first layer of liquid crystal polymer, is less than about 50 microns, wherein a spacing between the leads is less than about 35 microns, wherein the cable has more than 128 leads, wherein the cable has an L-shaped profile when viewed from a position normal to a plane of the cable and the cable lies flat along its plane.

11. A cable as recited in claim 9, wherein a spacing between the leads is less than about 35 microns.

12. A cable as recited in claim 10, further comprising a second layer of liquid crystal polymer, the leads being sandwiched by the first and second layers of liquid crystal polymer.

13. A cable as recited in claim 9, further comprising arrays of contact pads positioned towards opposite ends of the cable and in electrical communication with the leads, wherein each array of contact pads has a width measured between outermost contact pads thereof that is greater than a width measured between outermost of the leads near a middle of the cable.

14. A cable as recited in claim 9, wherein at least 32 electrically conductive leads are operatively coupled to the first layer of liquid crystal polymer, wherein the cable has an L-shaped profile when viewed from a position normal to a plane of the cable and the cable lies flat along its plane.

15. A cable as recited in claim 13, wherein at least 128 electrically conductive leads are operatively coupled to the first layer of liquid crystal polymer, wherein the cable has an L-shaped profile when viewed from a position normal to a plane of the cable and the cable lies flat along its plane.

16. A cable as recited in claim 9, wherein a width of each lead, in a direction perpendicular to an axis of the lead and parallel to a plane extending between the conductive leads and the first layer of liquid crystal polymer, is less than about 50 microns.

17. A tape drive system, comprising:
a magnetic head;
a drive mechanism for passing a magnetic recording tape over the head;
a flexible cable coupled to the magnetic head, the cable comprising a first layer of liquid crystal polymer; at least 32 electrically conductive leads directly adjacent the first layer of liquid crystal polymer,
wherein a width of each lead, in a direction perpendicular to an axis of the lead and parallel to a plane extending through several of the conductive leads, is less than about 75 microns,
wherein a spacing between all adjacent leads on a same side of the first layer of liquid crystal polymer is less than about 50 microns,
wherein the first layer of liquid crystal polymer has a planar upper surface on which the leads are positioned; wherein the cable further comprises a second layer of liquid crystal polymer having a lower surface having physical characteristics of formation over the leads and having ridges that extend downwardly between the leads;
a controller coupled to the cable, and communicating with the head using the cable; and
an actuator for changing a position of the magnetic head relative to the controller.

18. A tape drive system as recited in claim 17, wherein the width of each lead is less than about 50 microns, wherein all of the leads of the cable lie in a single plane.

19. A tape drive system as recited in claim 17, wherein at least some of the leads are positioned on one side of the first layer of liquid crystal polymer between the first and second layers of liquid crystal polymer, wherein other of the leads are positioned on a second side of the first layer of liquid crystal polymer; and further comprising a third layer of liquid crystal polymer having an upper surface having physical characteristics of formation over the leads on the second side of the first layer of liquid crystal polymer and having ridges that extend upwardly between the leads.

20. A tape drive system as recited in claim 19, wherein the cable has an L-shaped profile when viewed from a position normal to a plane of the cable and the cable lies flat along its plane.

* * * * *